(12) United States Patent
Zhang et al.

(10) Patent No.: US 9,601,528 B2
(45) Date of Patent: Mar. 21, 2017

(54) MANUFACTURING METHOD OF ARRAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Pengju Zhang, Beijing (CN); Xiaojian Du, Beijing (CN); Bo Gao, Beijing (CN); Han Ye, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/133,737

(22) Filed: Apr. 20, 2016

(65) Prior Publication Data

US 2016/0358953 A1  Dec. 8, 2016

(30) Foreign Application Priority Data

Jun. 8, 2015 (CN) .......................... 2015 1 0309946

(51) Int. Cl.
*H01L 27/12* (2006.01)
*H01L 21/027* (2006.01)
*H01L 21/311* (2006.01)
*H01L 21/02* (2006.01)
*H01L 29/51* (2006.01)
*H01L 29/423* (2006.01)

(52) U.S. Cl.
CPC ...... *H01L 27/1288* (2013.01); *H01L 21/0217* (2013.01); *H01L 21/0274* (2013.01); *H01L 21/02164* (2013.01); *H01L 21/31116* (2013.01); *H01L 27/124* (2013.01); *H01L 29/42356* (2013.01); *H01L 29/518* (2013.01)

(58) Field of Classification Search
CPC .......... H01L 27/1288; H01L 21/02164; H01L 21/0217; H01L 21/0274
USPC .................... 257/43, 751, 760; 349/106, 129
See application file for complete search history.

(56) References Cited

U.S. PATENT DOCUMENTS

2011/0242464 A1* 10/2011 Kawasaki ............. H01L 29/458
                                                        349/106
2014/0008645 A1*  1/2014 Yu ..................... H01L 29/66742
                                                         257/43

\* cited by examiner

*Primary Examiner* — Errol Fernandes
(74) *Attorney, Agent, or Firm* — Nath, Goldberg & Meyer; Joshua B. Goldberg

(57) ABSTRACT

The present invention provides a manufacturing method of an array substrate, comprising steps of: forming a gate and a gate line on a substrate; forming a gate insulating layer on the gate and the gate line; forming a pixel electrode on the gate insulating layer; and forming a first connecting via in a portion of the gate insulating layer in a non-display region and corresponding to the gate line, wherein the first connecting via is configured to connect a scanning signal trace to the gate line.

15 Claims, 6 Drawing Sheets

MANUFACTURING METHOD OF ARRAY SUBSTRATE

CROSS-REFERENCE TO RELATED APPLICATIONS

The present application claims the priority of Chinese Patent Application No. 201510309946.0, filed on Jun. 8, 2015, the contents of which are incorporated herein in their entirety by reference.

FIELD OF THE INVENTION

The present invention relates to the field of display technology, and in particular, relates to a manufacturing method of an array substrate.

BACKGROUND OF THE INVENTION

An array substrate is an important component of a liquid crystal display device, and is manufactured by depositing various films on a substrate using a plurality of patterning processes. Generally, a manufacturing method of an array substrate in the prior art includes:

A first step of forming a gate and a gate line on a substrate; a second step of depositing a gate insulating layer on the gate and the gate line; a third step of coating a whole layer of photoresist on the gate insulating layer; a fourth step of exposing the photoresist with a corresponding mask and developing the photoresist, such that a portion of the photoresist in a non-display region and corresponding to the gate line is removed; a fifth step of forming a first connecting via in a portion of the gate insulating layer in the non-display region and corresponding to the gate line by a patterning process, wherein the first connecting via is used for connecting a scanning signal trace formed in a subsequent step (and used for outputting a scanning drive signal to the gate line) to the gate line; and other steps of forming a pixel electrode, forming an active layer, forming a source/drain, and the like above the gate insulating layer.

Wherein, a whole layer of photoresist is coated on the gate insulating layer before the fifth step of forming a first connecting via in a portion of the gate insulating layer in the non-display region and corresponding to the gate line by a patterning process, and after the first connecting via is formed, the residual photoresist on the gate insulating layer is stripped off using stripping agent.

However, when the residual photoresist on the gate insulating layer is stripped off, it is found that since the first connecting via is only located in the non-display region and, a large amount of the residual photoresist (which is located in the whole of a display region and a part of the non-display region) is left on the gate insulating layer after the photoresist is developped, so that a large amount of the stripping agent is required for stripping off the residual photoresist and it is difficult to remove the residual photoresist completely. Thus, a subsequent step is adversely affected and a ratio of qualified products is low.

SUMMARY OF THE INVENTION

The present invention is to provide manufacturing methods of an array substrate. The manufacturing methods enable an amount of stripping agent used during formation of a first connecting via to be decreased effectively, and enable the residual photoresist on a gate insulating layer to be removed completely after a step of stripping off, thereby increasing a ratio of qualified products.

In order to achieve the above object, the present invention provides a manufacturing method of an array substrate, including steps of:

forming a gate and a gate line on a substrate;
forming a gate insulating layer on the gate and the gate line;
forming a pixel electrode on the gate insulating layer; and
forming a first connecting via in a portion of the gate insulating layer in a non-display region and corresponding to the gate line, wherein the first connecting via is configured to connect a scanning signal trace to the gate line.

Optionally, the step of forming a first connecting via in a portion of the gate insulating layer in a non-display region and corresponding to the gate line includes steps of:

coating a layer of photoresist on the pixel electrode and the gate insulating layer;
exposing the photoresist with a mask and developing the photoresist, such that a portion of the photoresist in a display region and on the pixel electrode is removed partially or completely, and a portion of the photoresist in the non-display region and corresponding to the gate line is removed completely;
etching the gate insulating layer to form the first connecting via in a portion of the gate insulating layer in the non-display region and corresponding to the gate line; and
stripping off residual photoresist.

Optionally, the photoresist is positive photoresist.

Optionally, the step of etching the gate insulating layer is performed by a dry etching process.

Optionally, the manufacturing method further includes steps of:

forming an active layer on the gate insulating layer;
forming a source and a drain on the active layer and forming a data line on the gate insulating layer, wherein the drain is connected to the pixel electrode:
forming a passivation layer on the source, the drain and the data line; and
forming a second connecting via in a portion of the passivation layer in the non-display region and corresponding to the gate line, and forming a third connecting via in a portion of the passivation layer in the non-display region and corresponding to the data line, wherein, the second connecting via is connected to the first connecting via, and the third connecting via is configured to connect a data signal trace to the data line.

Optionally, the manufacturing method further includes a step of:

forming a common electrode on the passivation layer.

Optionally, the gate insulating layer is made of at least one of silicon dioxide and silicon nitride.

Optionally, the pixel electrode is made of at least one of indium tin oxide and indium zinc oxide.

The advantageous technical effects of the present invention are as follows.

In the manufacturing method of an array substrate provided by the present invention, a pixel electrode is formed on a gate insulating layer before a first connecting via is formed in the gate insulating layer, such that the pixel electrode is used for protecting a large part of the gate insulating layer in a display region. Thus, during the process of etching the gate insulating layer to form the first connecting via, only a very thin layer of photoresist may be remained on the pixel electrode or the photoresist may be removed completely. In such a way, an amount of the residual photoresist on the gate insulating layer after the steps of exposing and developing is decreased; and the residual photoresist can be removed completely, thereby increasing a ratio of qualified products.

BRIEF DESCRIPTION OF THE DRAWINGS

FIG. 6 is a schematic diagram of a first connecting via formed in a step 1043a;

DETAILED DESCRIPTION OF THE EMBODIMENTS

To make those skilled in the art better understand the technical solutions of the present invention, manufacturing methods of an array substrate provided by the present invention will be described below in detail with reference to the accompanying drawings.

Figure 1:
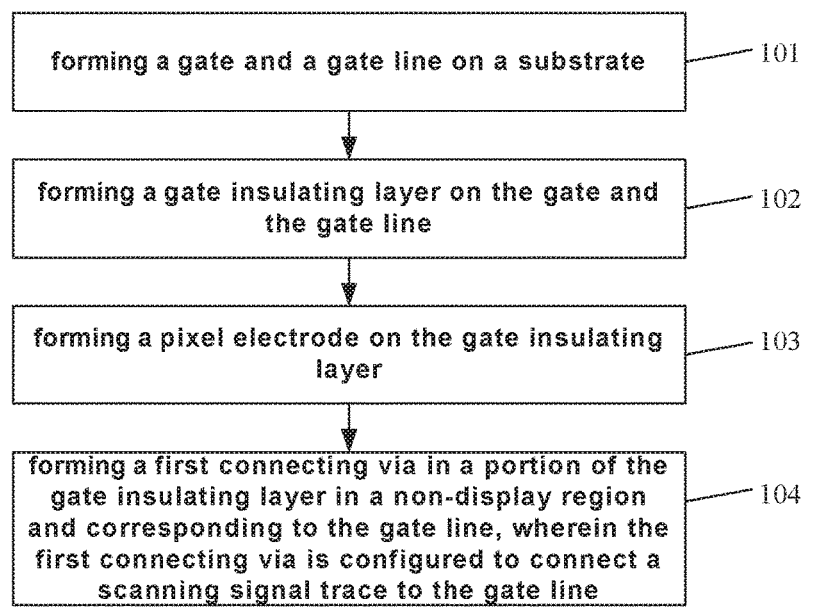
FIG. 1 is a flow chart of a manufacturing method of an array substrate provided by embodiments of the present invention.

FIG. 1 is a flow chart of a manufacturing method of an array substrate provided by embodiments of the present invention. As shown in FIG. 1, the manufacturing method includes the following steps 101 to 104.

Step 101: forming a gate and a gate line on a substrate.

Figure 2:
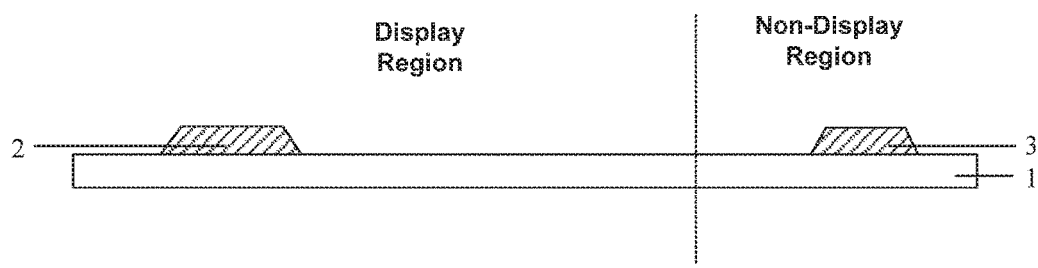
FIG. 2 is a schematic diagram illustrating formation of a gate and a gate line on a substrate.

FIG. 2 is a schematic diagram illustrating formation of a gate and a gate line on a substrate. As shown in FIG. 2, an array substrate in the present embodiment includes a display region and a non-display region surrounding the display region. In the step 101, a gate 2 and a gate line 3 are formed on a substrate 1 by a single patterning process, wherein the gate line 3 runs through the display region and the non-display region.

In should be noted that, a patterning process used herein specifically refers to a process including steps of photoresist coating, exposing, developing, etching, and photoresist stripping, and the like.

Step 102: forming a gate insulating layer on the gate and the gate line.

Figure 3:
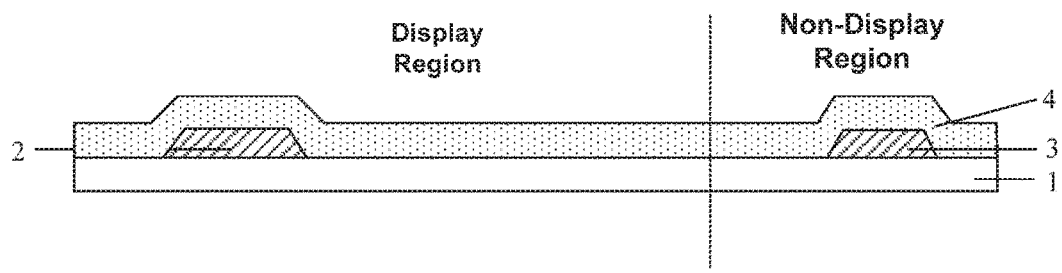
FIG. 3 is a schematic diagram illustrating formation of a gate insulating layer on the gate and the gate line.

FIG. 3 is a schematic diagram illustrating formation of a gate insulating layer on the gate and the gate line. As shown in FIG. 3, in the step 102, a gate insulating layer 4 is deposited on the substrate manufactured in the step 101 by a vapor deposition process.

Optionally, the gate insulating layer 4 in the present embodiment may be made of at least one of silicon dioxide and silicon nitride.

Step 103: forming a pixel electrode on the gate insulating layer.

Figure 4:
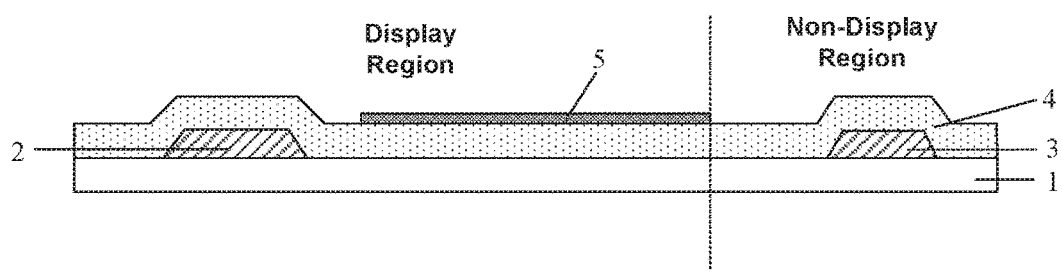
FIG. 4 is a schematic diagram illustrating formation of a pixel electrode on the gate insulating layer.

FIG. 4 is a schematic diagram illustrating formation of a pixel electrode on the gate insulating layer. As shown in FIG. 4, in the step 103, a pixel electrode 5 is formed on the gate insulating layer 4 by a patterning process. Optionally, the pixel electrode 5 is made of at least one of indium tin oxide and indium zinc oxide.

Step 104: forming a first connecting via in a portion of the gate insulating layer in the non-display region and corresponding to the gate line by a patterning process.

As an optional scheme, the step 104 may include the following steps 1041a to 1044a.

Step 1041a: coating a layer of photoresist on the pixel electrode and the gate insulating layer.

In the step 1041a, optionally, the photoresist may be a positive photoresist.

Step 1042a: exposing the photoresist with a mask and developing the photoresist, such that a portion of the photoresist in the display region and on the pixel electrode is removed partially, and a portion of the photoresist in the non-display region and corresponding to the gate line is removed completely.

Figure 5:
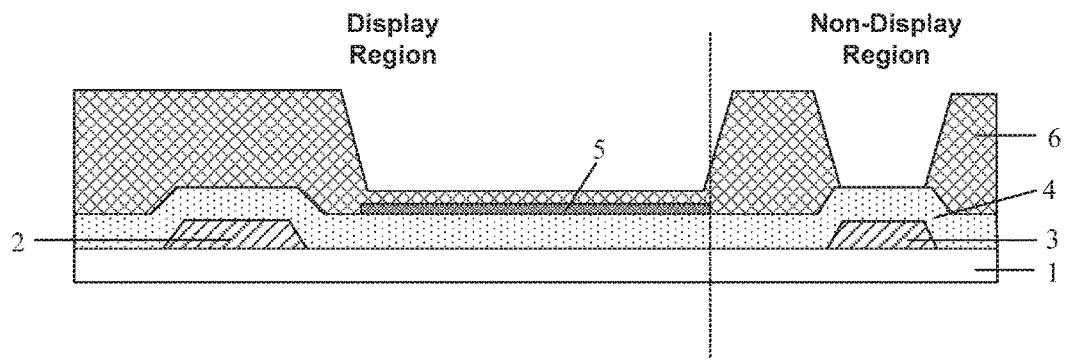
FIG. 5 is a schematic diagram of a resultant structure after a step 1042a of exposing and developing.

FIG. 5 is a schematic diagram of a resultant structure after the step 1042a of exposing and developing. As shown in FIG. 5, a mask used in the step 1042a differs from a mask used for forming a first connecting via in the prior art in that: the mask used in the step 1042a is a halftone mask, and a portion of this mask corresponding to the pixel electrode 5 is a light partially transmissive region. In this case, a portion of the photoresist 6 corresponding to the pixel electrode 5 will be partially removed after the steps of exposing and developing (in other words, the portion of the photoresist 6 corresponding to the pixel electrode will be partially remained). Since a portion of photoresist on a gate insulating layer in a display region will be completely remained after the steps of exposing and developing in the prior art, an amount of the residual photoresist 6 on the gate insulating layer 4 after the steps of exposing and developing in the present invention will be decreased significantly relative to that in the prior art.

Step 1043a: etching the gate insulating layer to form the first connecting via in a portion of the gate insulating layer in the non-display region and corresponding to the gate line.

Figure 6:
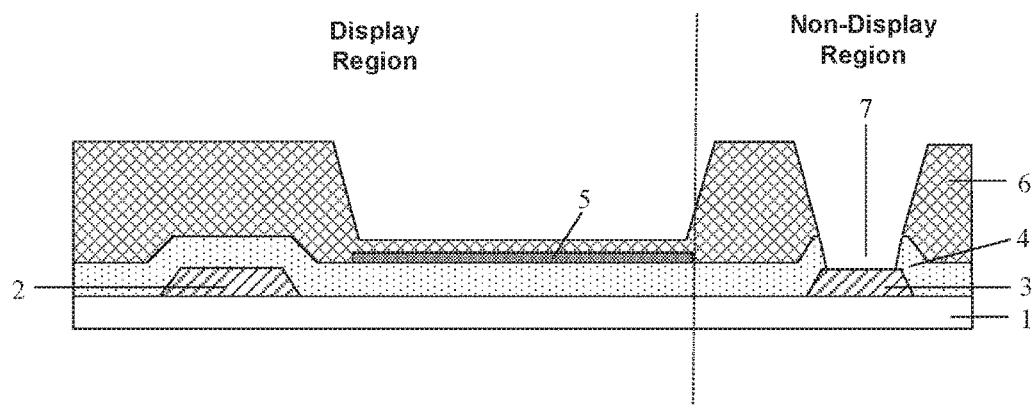

FIG. 6 is a schematic diagram of the first connecting via formed in a step 1043a. As shown in FIG. 6, in the step 1043a, the gate insulating layer 4 is etched by an etching process. During etching, only a portion of the gate insulating layer 4 in the non-display region and corresponding to the gate line 3 is etched under the protection of the photoresist 6 to form a first connecting via 7, and the first connecting via 7 is configured to connect a scanning signal trace to the gate line 3.

It should be noted that, even a relatively small amount of photoresist 6 is left on the pixel electrode 5 in the step 1042a, the presence of the pixel electrode 5 prevents a portion of the gate insulating layer 4 right under the pixel electrode 5 from being etched.

Optionally, the step of etching the gate insulating layer 4 is performed by a dry etching process.

Step 1044a: stripping off residual photoresist (i.e., a residual portion of the photoresist 6).

Figure 7:
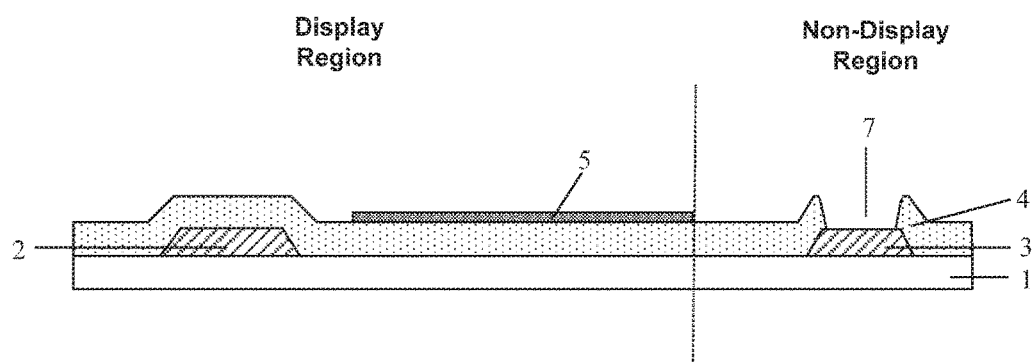
FIG. 7 is a schematic diagram of a resultant structure after a step 1044a of stripping off the residual photoresist.

FIG. 7 is a schematic diagram of a resultant structure after the step 1044a of stripping off the residual photoresist. As shown in FIG. 7, in the step 1044a, the photoresist 6 is processed with stripping agent, such that the photoresist 6 is separated from the substrate. Since a relatively small amount of the photoresist 6 is left on the substrate in the step 1042a, a relatively small amount of stripping agent is required in the step 1044a. Furthermore, the residual photoresist 6 on the substrate will be stripped off completely, thereby increasing a ration of qualified products.

As an alternative scheme, the step 104 may include the following steps 1041b to 1044b.

Step 1041b: coating a layer of photoresist on the pixel electrode and the gate insulating layer.

The step 1041b is the same as the step 1041a as described above, and detailed description thereof is omitted.

Step 1042b: exposing the photoresist with a mask and developing the photoresist, such that a portion of the photoresist in the display region and on the pixel electrode is removed completely, and a portion of the photoresist in the non-display region and corresponding to the gate line is removed completely.

Figure 8:
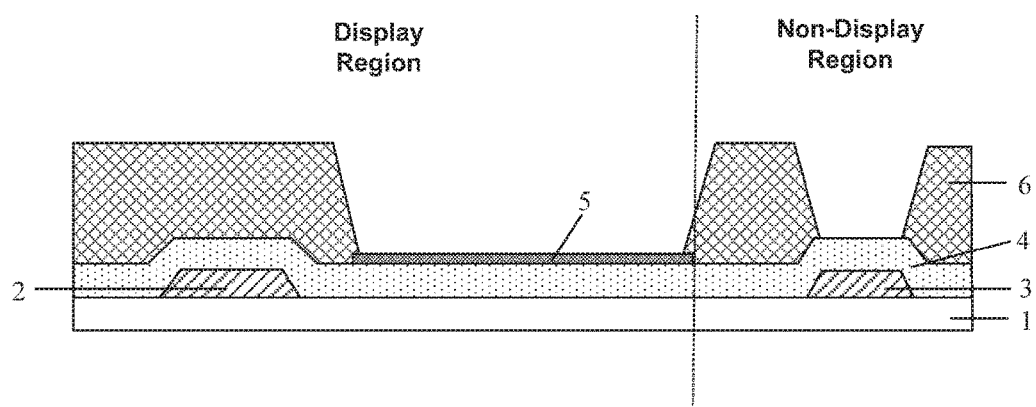
FIG. 8 is a schematic diagram of a resultant structure after a step 1042b of exposing and developing.

FIG. 8 is a schematic diagram of a resultant structure after the step 1042b of exposing and developing. As shown in FIG. 8, a mask used in the step 1042b differs from the mask used in the step 1042a in that: a portion, corresponding to the pixel electrode, of the mask used in the step 1042b is a light completely transmissive region. In this case, a portion of the photoresist 6 corresponding to the pixel electrode 5 will be completely removed after the steps of exposing and developing. Thus, as compared with the amount of the residual photoresist 6 on the gate insulating layer after the steps of exposing and developing in the step 1042a, a smaller amount of the photoresist 6 is left on the gate insulating layer 4 after the steps of exposing and developing in the step 1042b.

Step 1043b: etching the gate insulating layer to form the first connecting via in a portion of the gate insulating layer in the non-display region and corresponding to the gate line.

Figure 9:
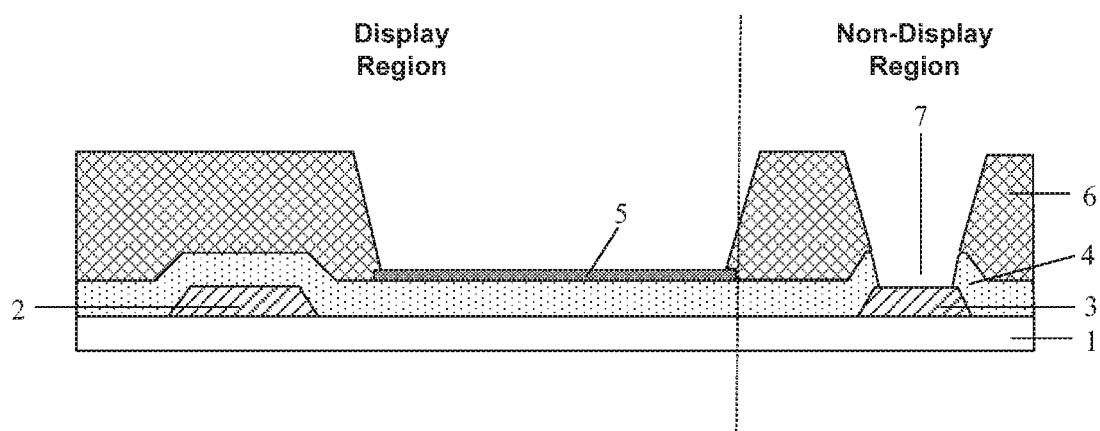
FIG. 9 is a schematic diagram of a first connecting via formed in a step 1043b.

FIG. 9 is a schematic diagram of the first connecting via formed in the step 1043b. As shown in FIG. 9, in the step 1043b, the gate insulating layer 4 is etched by an etching process. During etching, since a plasma etching gas will not cause the pixel electrode to be etched, only a portion of the gate insulating layer 4 in the non-display region and corresponding to the gate line 3 is etched under the protection of the photoresist 6 and the pixel electrode 5 to form a first connecting via 7.

Step 1044b: stripping off residual photoresist (i.e., a residual portion of the photoresist 6).

Since the amount of the residual photoresist 6 on the gate insulating layer in the step 1042b is smaller than the amount of the residual photoresist 6 on the gate insulating layer 4 in the step 1042b, an amount of the stripping agent used in the step 1044b is smaller than the amount of the stripping agent used in the step 1044a either. The structure as shown in FIG. 7 is obtained after the step 1044b is finished.

Figure 10:
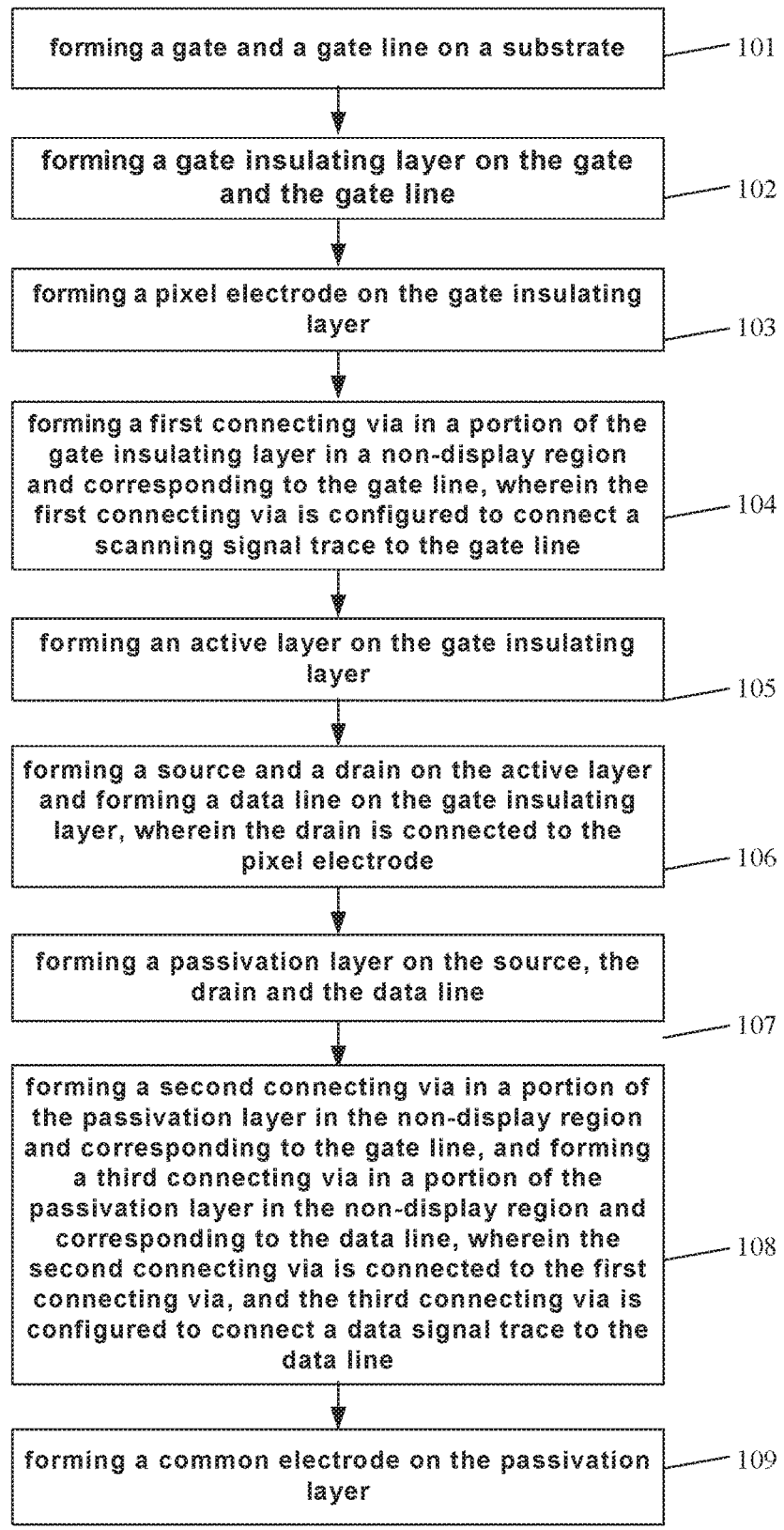
FIG. 10 is a flow chart of another manufacturing method of an array substrate provided by embodiments of the present invention.
Figure 11:
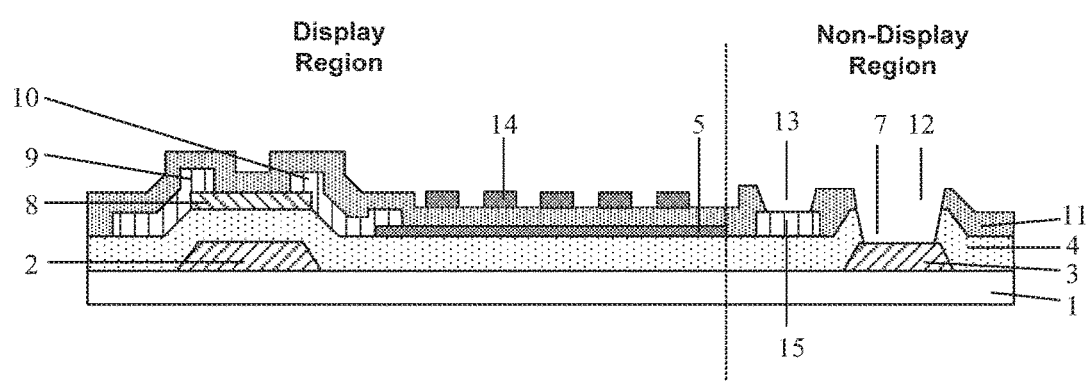
FIG. 11 is a schematic diagram of a structure of an array substrate manufactured by the manufacturing method as shown in FIG. 10.

FIG. 10 is a flow chart of another manufacturing method of an array substrate provided by embodiments of the present invention, and FIG. 11 is a schematic diagram of a structure of an array substrate manufactured by the manufacturing method as shown in FIG. 10. As shown in FIGS. 10 and 11, the present manufacturing method further includes the following steps 105 to 109 in addition to the above steps 101 to 104.

Step 105: forming an active layer on the gate insulating layer.

In the step 105, an active layer 8 is formed on the gate insulating layer 4 by a patterning process:

Step 106: forming a source and a drain on the active layer and forming a data line on the gate insulating layer, wherein the drain is connected to the pixel electrode.

In the step 106, a source 9 and a drain 10 are formed on the active layer 8 and a data line 15 is formed on the gate insulating layer 4 by a single patterning process, wherein, the drain 10 is connected to the pixel electrode 5, and the data line 15 runs through the display region and the non-display region (not shown in the figures).

Step 107: forming a passivation layer on the source, the drain and the data line.

In the step 107, a passivation layer 11 is deposited on the substrate manufactured in the step 106 by a vapor deposition process.

Step 108: forming a second connecting via in a portion of the passivation layer in the non-display region and corresponding to the gate line, and forming a third connecting via in a portion of the passivation layer in the non-display region and corresponding to the data line, wherein the second connecting via is connected to the first connecting via.

In the step 108, a second connecting via 12 and a third connecting via 13 are formed by a single patterning process, wherein the second connecting via 12 is connected to the first connecting via 7 so as to connect a scanning signal trace formed later to the gate line 3. The third connecting via 13 is configured to connect a data signal trace to the data line 15, and the data signal trace is configured to transmit a data signal to the data line 15.

Step 109: forming a common electrode on the passivation layer.

In the step 109, a common electrode 14 is formed on the passivation layer 11 by a single patterning process.

It should be noted that, in a case where the array substrate is an array substrate of a TN-type display panel, the step 109 is not necessary.

In the manufacturing methods of an array substrate provided by the embodiments of the present invention, the pixel electrode is formed on the gate insulating layer before the first connecting via is formed in the gate insulating layer, such that the pixel electrode is used for protecting a large part of the gate insulating layer in the display region. Thus, during etching the gate insulating layer to form the first connecting via, only a very thin layer of photoresist may be remained on the pixel electrode or the photoresist may be removed completely. In such a way, an amount of the residual photoresist on the gate insulating layer after the steps of exposing and developing is decreased, and the residual photoresist can be removed completely, thereby increasing a ratio of qualified products.

It should be understood that, the foregoing embodiments are only exemplary embodiments used for explaining the principle of the present invention, but the present invention is not limited thereto. Various variations and improvements may be made by a person skilled in the art without departing from the protection scope of the present invention, and these variations and improvements also fall into the protection scope of the present invention.

What is claimed is:

1. A manufacturing method of an array substrate, comprising steps of:
   forming a gate and a gate line on a substrate;
   forming a gate insulating layer on the gate and the gate line;
   forming a pixel electrode on the gate insulating layer; and
   forming a first connecting via in a portion of the gate insulating layer in a non-display region and corresponding to the gate line, wherein the first connecting via is configured to connect a scanning signal trace to the gate line, wherein, the step of forming a first connecting via in a portion of the gate insulating layer in a non-display region and corresponding to the gate line comprises steps of:

coating a layer of photoresist on the pixel electrode and the gate insulating layer;

exposing the photoresist with a mask and developing the photoresist, such that a portion of the photoresist in a display region and on the pixel electrode is removed partially or completely, and a portion of the photoresist in the non-display region and corresponding to the gate line is removed completely;

etching the gate insulating layer to form the first connecting via in a portion of the gate insulating layer in the non-display region and corresponding to the gate line; and stripping off residual photoresist.

2. The manufacturing method according to claim 1, wherein, the photoresist is positive photoresist.

3. The manufacturing method according to claim 2, wherein, the gate insulating layer is made of at least one of silicon dioxide and silicon nitride.

4. The manufacturing method according to claim 2, wherein, the pixel electrode is made of at least one of indium tin oxide and indium zinc oxide.

5. The manufacturing method according to claim 1, wherein, the step of etching the gate insulating layer is performed by a dry etching process.

6. The manufacturing method according to claim 5, wherein, the gate insulating layer is made of at least one of silicon dioxide and silicon nitride.

7. The manufacturing method according to claim 5, wherein, the pixel electrode is made of at least one of indium tin oxide and indium zinc oxide.

8. The manufacturing method according to claim 1, further comprising steps of:

forming an active layer on the gate insulating layer;

forming a source and a drain on the active layer and forming a data line on the gate insulating layer, wherein the drain is connected to the pixel electrode;

forming a passivation layer on the source, the drain and the data line; and forming a second connecting via in a portion of the passivation layer in the non-display region and corresponding to the gate line, and forming a third connecting via in a portion of the passivation layer in the non-display region and corresponding to the data line, wherein, the second connecting via is connected to the first connecting via, and the third connecting via is configured to connect a data signal trace to the data line.

9. The manufacturing method according to claim 8, further comprising a step of: forming a common electrode on the passivation layer.

10. The manufacturing method according to claim 9, wherein, the gate insulating layer is made of at least one of silicon dioxide and silicon nitride.

11. The manufacturing method according to claim 9, wherein, the pixel electrode is made of at least one of indium tin oxide and indium zinc oxide.

12. The manufacturing method according to claim 8, wherein, the gate insulating layer is made of at least one of silicon dioxide and silicon nitride.

13. The manufacturing method according to claim 8, wherein, the pixel electrode is made of at least one of indium tin oxide and indium zinc oxide.

14. The manufacturing method according to claim 1, wherein, the gate insulating layer is made of at least one of silicon dioxide and silicon nitride.

15. The manufacturing method according to claim 1, wherein, the pixel electrode is made of at least one of indium tin oxide and indium zinc oxide.

* * * * *